United States Patent
Chang et al.

(10) Patent No.: US 7,619,925 B2
(45) Date of Patent: Nov. 17, 2009

(54) VIRTUAL GROUND ARRAY MEMORY AND PROGRAMMING METHOD THEREOF

(75) Inventors: Chin-Hung Chang, Tainan (TW); Wen-Chiao Ho, Tainan (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 59 days.

(21) Appl. No.: 11/892,979

(22) Filed: Aug. 29, 2007

(65) Prior Publication Data

US 2009/0059668 A1  Mar. 5, 2009

(51) Int. Cl.
*G11C 16/04* (2006.01)
(52) U.S. Cl. .............. 365/185.16; 365/185.09; 365/185.22
(58) Field of Classification Search .......... 365/185.16, 365/185.17, 185.18, 185.22, 185.09
See application file for complete search history.

(56) References Cited

U.S. PATENT DOCUMENTS

| | | | |
|---|---|---|---|
| 7,295,471 B2 * | 11/2007 | Hsieh et al. | 365/185.22 |
| 7,313,649 B2 * | 12/2007 | Tomita et al. | 365/185.22 |
| 7,382,656 B2 * | 6/2008 | Ho et al. | 365/185.22 |
| 2005/0232024 A1 * | 10/2005 | Atir et al. | 365/189.04 |
| 2006/0109710 A1 * | 5/2006 | Hsieh et al. | 365/185.2 |
| 2007/0183240 A1 * | 8/2007 | Maruyama et al. | 365/210 |

* cited by examiner

*Primary Examiner*—Tuan T Nguyen
*Assistant Examiner*—Hien N Nguyen
(74) *Attorney, Agent, or Firm*—Bacon & Thomas, PLLC

(57) ABSTRACT

A method for programming a virtual ground array memory, which includes a first cell and a second cell adjacent to first cell, includes the following steps. First, the first cell is selected as a target cell, wherein the second cell has been programmed to have data. Next, the second cell is read and the data is recorded in a register. Then, the target cell is programmed. Next, a program verifying operation is performed on the second cell. Afterwards, the data recorded in the register is programmed back to the second cell when the program verifying operation performed on the second cell fails.

7 Claims, 3 Drawing Sheets

VIRTUAL GROUND ARRAY MEMORY AND PROGRAMMING METHOD THEREOF

BACKGROUND OF THE INVENTION

1. Field of the Invention

The invention relates in general to a virtual ground array memory and a programming method thereof, and more particularly to a virtual ground array memory and a programming method thereof capable of solving an array effect.

2. Description of the Related Art

In a conventional virtual ground array memory, adjacent two cells may produce an array effect due to different phases, thereby causing the shift of a threshold voltage and a read window loss or even the read failure.

FIG. 1A (Prior Art) is a schematic illustration showing a conventional virtual ground array memory. Referring to FIG. 1A, a virtual ground array memory 100 includes a first memory cell block 110 and a second memory cell block 120. Illustrations will be made by taking a boundary cell 111 in the first memory cell block 110 and a neighboring cell 121 in the second memory cell block 120 as an example. After the neighboring cell 121 is programmed, a program verifying operation is performed on the neighboring cell 121 in order to verify whether the threshold voltage of the neighboring cell 121 is sufficiently high.

FIG. 1B (Prior Art) shows a threshold voltage distribution of the neighboring cell 121. As shown in FIG. 1B, when the neighboring cell 121 passes the program verifying operation, its threshold voltage is a high threshold voltage 130. At this time, because a leakage current $I_{leak}$ flowing from the neighboring cell 121 to the boundary cell 111 exists, a sense current $I_{sense}$ received by a sense amplifier (not shown) is unequal to a cell current $I_{cell}$ of the neighboring cell 121.

Consequently, when the boundary cell 111 is being programmed, the leakage current $I_{leak}$ decreases and the sense current $I_{sense}$ increases because the threshold voltage of the boundary cell 111 is sufficiently high. Thus, the neighboring cell 121 is judged as having the insufficiently high threshold voltage, and the threshold voltage of the neighboring cell 121 is shifted downwards from the high threshold voltage 130 to a high threshold voltage 131. Thus, the read window is reduced or even the read may fail in a more serious condition.

SUMMARY OF THE INVENTION

The invention is directed to a virtual ground array memory and a method for programming the virtual ground array memory, wherein a data recovering algorithm is embedded in a programming procedure in order to solve an array effect and eliminate a read window loss caused by the array effect.

According to a first aspect of the present invention, a method for programming a virtual ground array memory is provided. The virtual ground array memory includes a first cell and a second cell adjacent to the first cell. The method includes the following steps. First, the first cell is selected as a target cell, wherein the second cell has been programmed to have data. Next, the second cell is read, and the data is recorded in a register. Then, the target cell is programmed. Next, a program verifying operation is performed on the second cell. Afterwards, the data recorded in the register is programmed back to the second cell when the program verifying operation performed on the second cell fails.

According to a second aspect of the present invention, a virtual ground array memory including a first memory cell block, a second memory cell block and a register is provided. The first memory cell block has a boundary cell. The second memory cell block has a neighboring cell, which is adjacent to the boundary cell and has been programmed to have data. The register records the data of the neighboring cell. After the boundary cell is programmed, a program verifying operation is performed on the neighboring cell. When the program verifying operation performed on the neighboring cell fails, the data recorded in the register is programmed back to neighboring cell.

The invention will become apparent from the following detailed description of the preferred but non-limiting embodiment. The following description is made with reference to the accompanying drawings.

DETAILED DESCRIPTION OF THE INVENTION

The invention provides a virtual ground array memory and a programming method thereof, in which a data recovering algorithm is embedded into a programming procedure in order to solve an array effect and eliminate a read window loss of a memory cell caused by the array effect.

Figure 2:
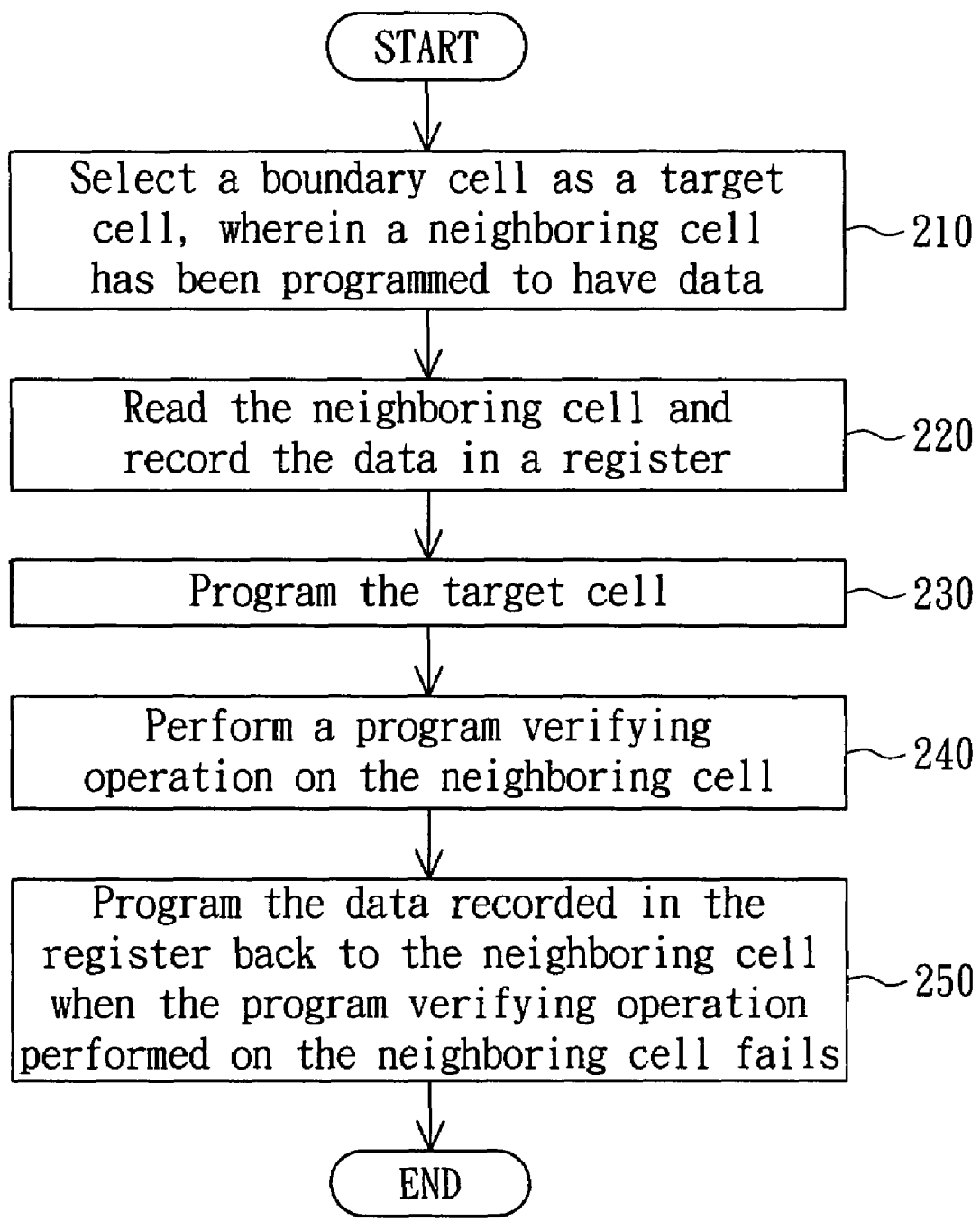
FIG. 2 is a flow chart showing a method for programming a virtual ground array memory according to the preferred embodiment of the invention.

FIG. 2 is a flow chart showing a method for programming a virtual ground array memory according to the preferred embodiment of the invention. This method is applied to the virtual ground array memory, which includes a boundary cell and a neighboring cell adjacent to the boundary cell. The boundary cell is disposed in a first memory cell block and the neighboring cell is disposed in a second memory cell block. So, phases of the boundary cell and the neighboring cell may be different from each other. For example, the neighboring cell has been programmed to have data, and the boundary cell is to be programmed. Because the boundary cell and the neighboring cell have different phases, the array effect may be generated.

In the invention, first, in step 210, the boundary cell is selected as a target cell, which is to be programmed. Meanwhile, the neighboring cell has been programmed to have the data because it is disposed in the memory cell block having a different phase. Next, before the target cell is programmed, the neighboring cell is read and the data previously stored in the neighboring cell is recorded in a register in step 220. This register is, without limitation to, a static random access memory (SRAM) in the virtual ground array memory, for example.

Then, in step 230, a programming operation is performed on the target cell. In the substantial operating procedure of step 230, all cells in the first memory cell block are sequentially programmed until the cells are all programmed. After the target cell is programmed, the leakage current flowing from the neighboring cell to the target cell is decreased, the array effect is thus generated, and the read window loss is produced in the neighboring cell because the threshold voltage of the target cell is high enough.

Thus, in step 240, a program verifying operation is performed on the neighboring cell. Step 240 substantially judges whether the read window loss of the neighboring cell caused by the array effect is too great. If the neighboring cell has passed the program verifying operation, it represents that the read window loss of the neighboring cell is within an acceptable range without influencing the correctness of reading the data stored in the neighboring cell.

When the program verifying operation of the neighboring cell fails, it represents that the threshold voltage of the neighboring cell is shifted downwards too much due to the array effect, thereby causing the too large read window loss and the read error. Thus, in step 250, the data recorded in the register is programmed back to the neighboring cell. Consequently, a sense amplifier in the virtual ground array memory senses that the data stored in the neighboring cell is still the original data, and the read correctness may be ensured.

In addition, in the above-mentioned programming method of the virtual ground array memory, if the data originally stored in the neighboring cell corresponds to a high threshold voltage (e.g., the data may be "0"), the failure of the program verifying operation performed on the neighboring cell represents that the high threshold voltage is shifted downwards. If the high threshold voltage is shifted downwards too much, the read error may occur and the shifted threshold voltage may be regarded as a low threshold voltage. Thus, in step 250, the data recorded in the register is programmed back to the neighboring cell.

In addition, if the data originally stored in the neighboring cell corresponds to a low threshold voltage (e.g., the data is "1"), the failure of the program verifying operation performed on the neighboring cell represents that the low threshold voltage is shifted downwards, and the read error cannot occur. So, step 250 may be omitted.

Figure 1A:
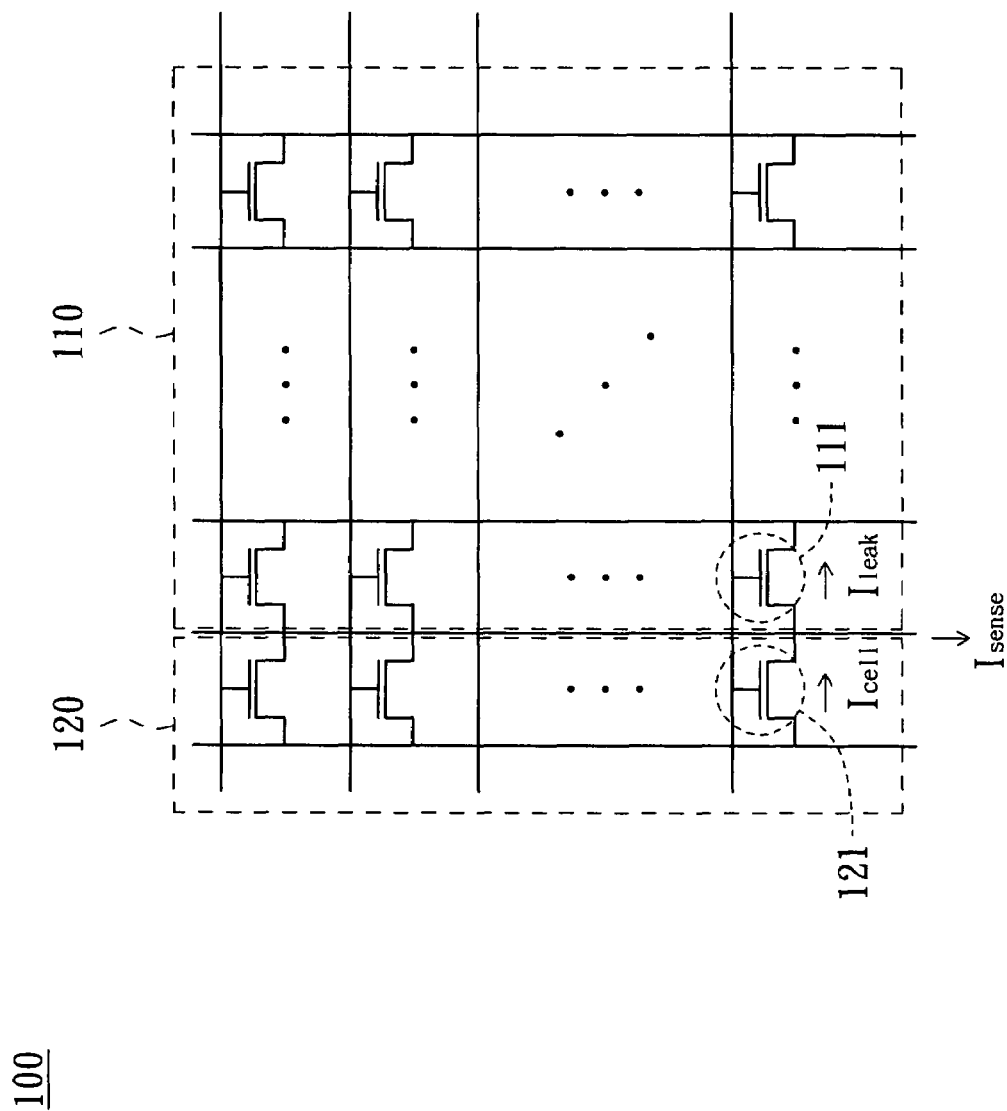
FIG. 1A (Prior Art) is a schematic illustration showing a conventional virtual ground array memory.
Figure 1B:
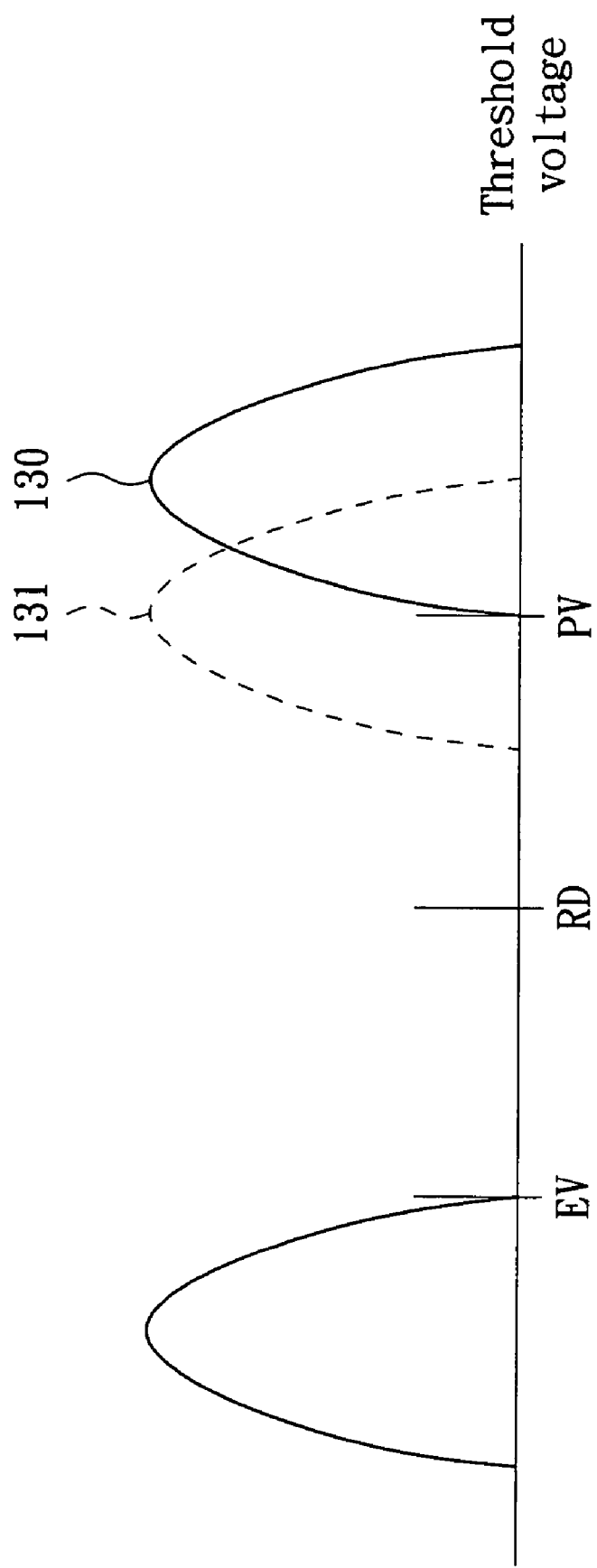
FIG. 1B (Prior Art) shows a threshold voltage distribution of a neighboring cell 121.

The invention also discloses a virtual ground array memory having the circuit architecture similar to that of the virtual ground array memory 100 of FIG. 1A. The virtual ground array memory of the invention includes a first memory cell block, a second memory cell block and a register. The first memory cell block has a boundary cell. The second memory cell block has a neighboring cell adjacent to the boundary cell and has been programmed to have data. The register records the data. The operation principle of the virtual ground array memory has been described in the above-mentioned programming method of the virtual ground array memory, so detailed descriptions thereof will be omitted.

In the virtual ground array memory and the programming method thereof according to the embodiment of the invention, an embedded read window recovering algorithm is utilized when the boundary cell is being programmed. Thus, the array effect generated on the boundary of the memory cell block in the virtual ground array memory may be eliminated, the read window loss of the neighboring cell caused by the array effect may be eliminated, the correctness of reading the neighboring cell may be ensured, and the read error of the neighboring cell may be avoided.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a memory, which comprises a first memory cell block having a first cell and a second memory cell block having a second cell which is adjacent to the first cell, the method comprising the steps of:
   selecting the first cell as a target cell, wherein the second cell has been programmed to have data;
   reading the second cell and recording the data in a register;
   programming the target cell;
   performing a program verifying operation on the second cell; and
   programming the data, which is recorded in the register, back to the second cell when the program verifying operation performed on the second cell fails.

2. The method according to claim 1, wherein the data corresponds to a high threshold voltage, and the data is programmed back to the second cell when the program verifying operation performed on the second cell fails.

3. A memory, comprising:
   a first memory cell block having a boundary cell;
   a second memory cell block having a neighboring cell, which is adjacent to the boundary cell and programmed to have data; and
   a register for recording the data read from the neighboring cell,
   wherein a program verifying operation is performed on the neighboring cell after the boundary cell is programmed, and
   the data recorded in the register is programmed back to the neighboring cell when the program verifying operation performed on the neighboring cell fails.

4. The memory according to claim 3, wherein the data of the neighboring cell corresponds to a high threshold voltage, and the data is programmed back to the neighboring cell when the program verifying operation performed on the neighboring cell fails.

5. The memory according to claim 3, wherein the register is a static random access memory.

6. The memory according to claim 3, wherein the memory is a virtual ground array memory.

7. A method for programming a memory, which comprises a first memory cell block having a first cell and a second memory cell block having a second cell which is adjacent to the first cell, the method comprising the steps of:
   selecting the first cell as a target cell, wherein the second cell has been programmed to have data;
   reading the second cell and recording the data in a register;
   programming the target cell with a threshold voltage of the second cell shifting downwards;
   performing a program verifying operation on the second cell; and
   programming the data, which is recorded in the register, back to the second cell when the program verifying operation performed on the second cell fails.

* * * * *